(12) United States Patent
Good et al.

(10) Patent No.: US 6,400,232 B1
(45) Date of Patent: Jun. 4, 2002

(54) VARIABLE DUTY CYCLE OSCILLATOR CIRCUIT WITH FIXED MINIMUM AND MAXIMUM DUTY CYCLES

(75) Inventors: Brian K. Good, Greentown; Mark Wendell Gose, Kokomo; Gregg Nelson Francisco, Cicero, all of IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/567,599

(22) Filed: May 10, 2000

(51) Int. Cl.[7] ...................... H03K 3/017; H03K 3/0231; H03K 7/08
(52) U.S. Cl. ...................... 331/143; 332/109; 323/288; 363/41
(58) Field of Search ................................. 331/111, 143; 332/109, 110; 323/288; 363/41

(56) References Cited

U.S. PATENT DOCUMENTS 5,565,819 A * 10/1996 Cooper ...................... 331/143
5,808,455 A * 9/1998 Schwartz et al. ........... 323/271

* cited by examiner

Primary Examiner—Siegfried H. Grimm
(74) Attorney, Agent, or Firm—Jimmy L. Funke

(57) ABSTRACT

An oscillator circuit includes an oscillation circuit producing a RAMP signal and at least two control signals STATE2 and STATE3, and a comparator comparing an externally produced error signal ERR with the RAMP signal. When the ERR signal is between minimum and maximum levels of the RAMP signal, the duty cycle of a PWMOUT signal of the oscillator circuit varies as a function of the difference between the ERR and RAMP signals, and preferably accounts for approximately 85% of the total period. When the ERR signal is less than or equal to the minimum level of the RAMP signal, the duty cycle of the PWMOUT signal is fixed at a first value which is preferably approximately 5% of the total duty cycle. When the ERR signal is greater than or equal to the maximum level of the RAMP signal, the duty cycle of the PWMOUT signal is fixed at a second value which is preferably approximately 90% of the total period. The three foregoing states of operation are established by the oscillation circuit as a function of the ratios of three capacitors relative to each other.

20 Claims, 6 Drawing Sheets

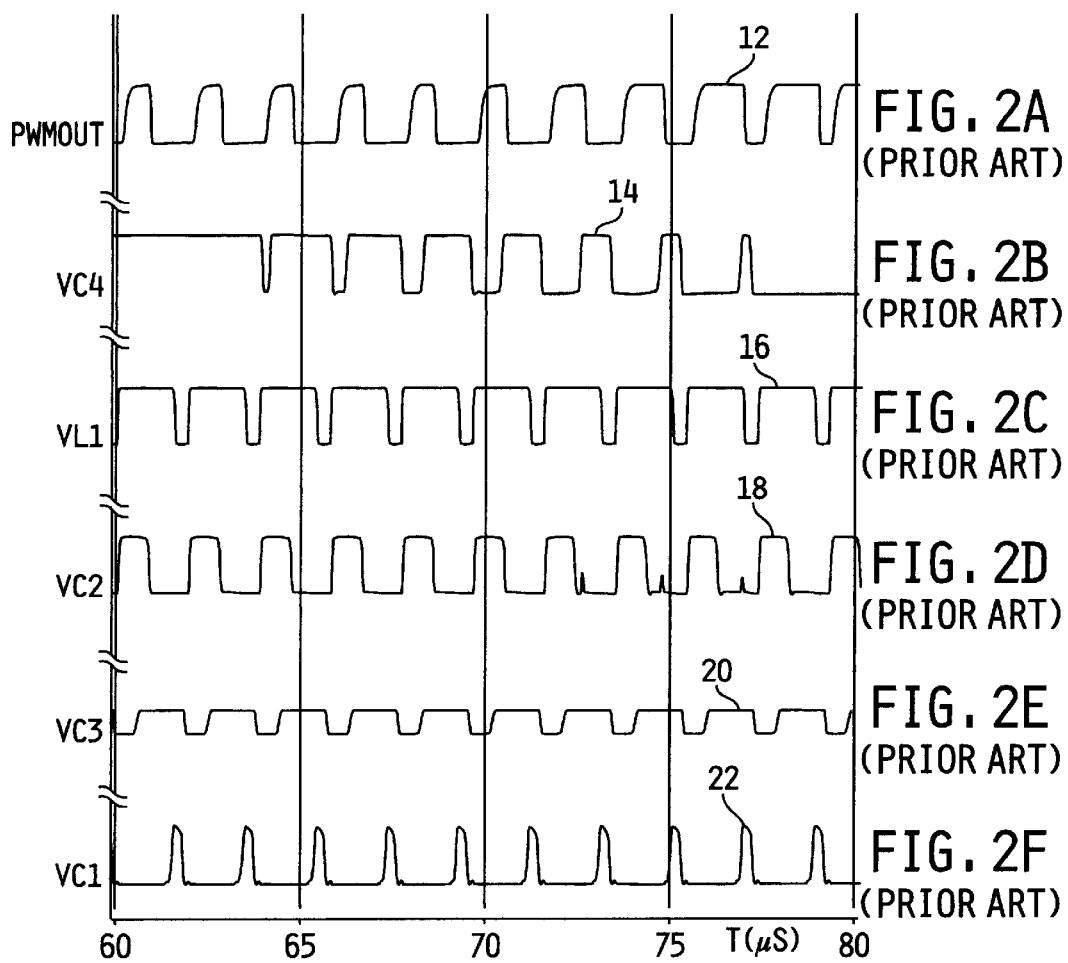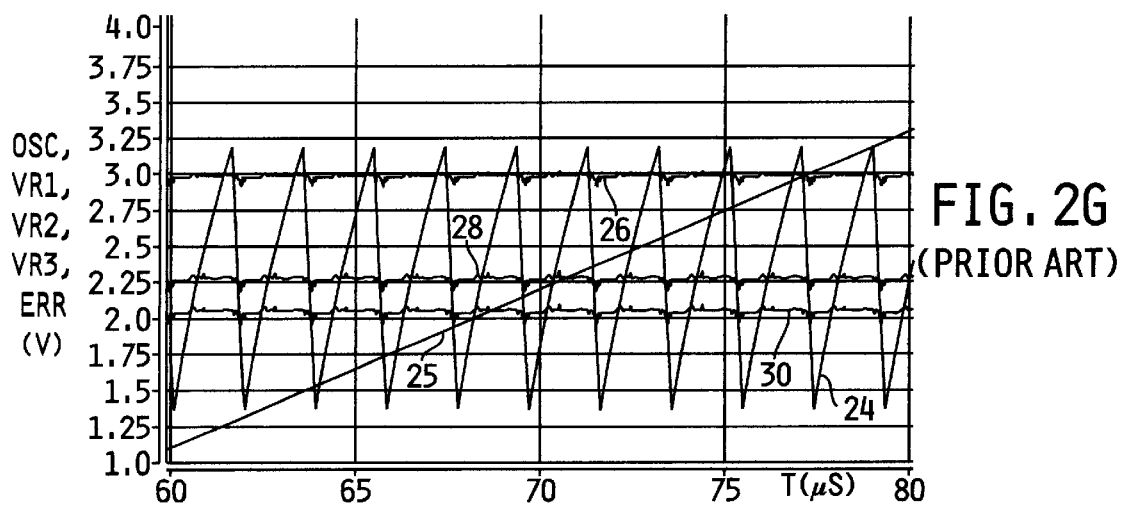

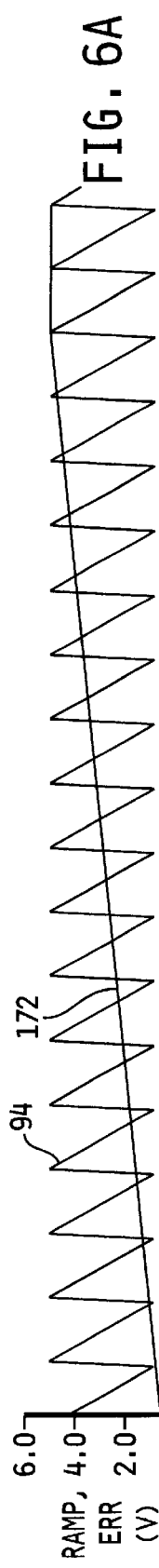
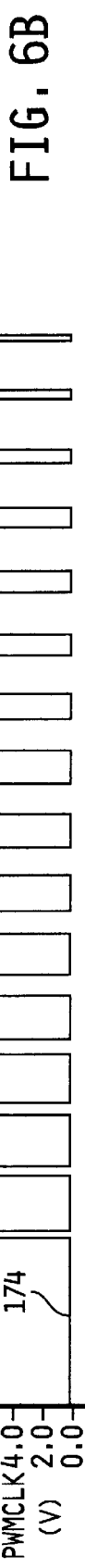
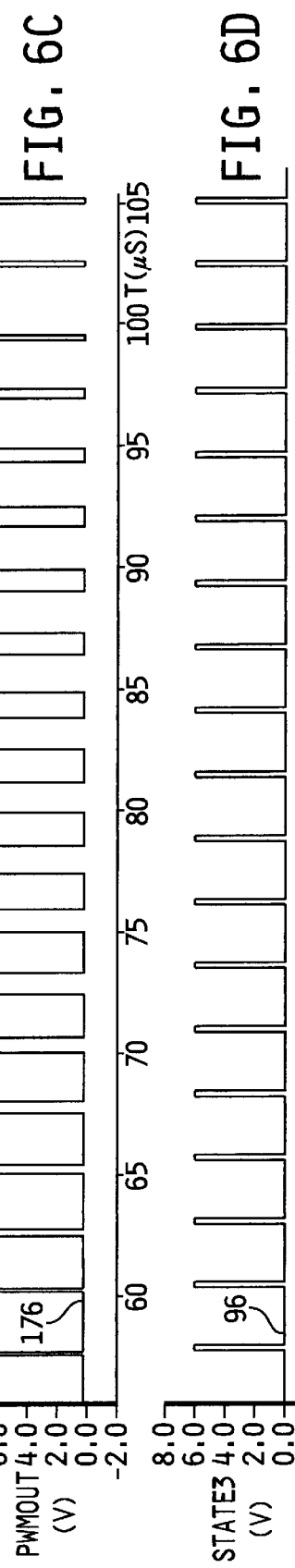
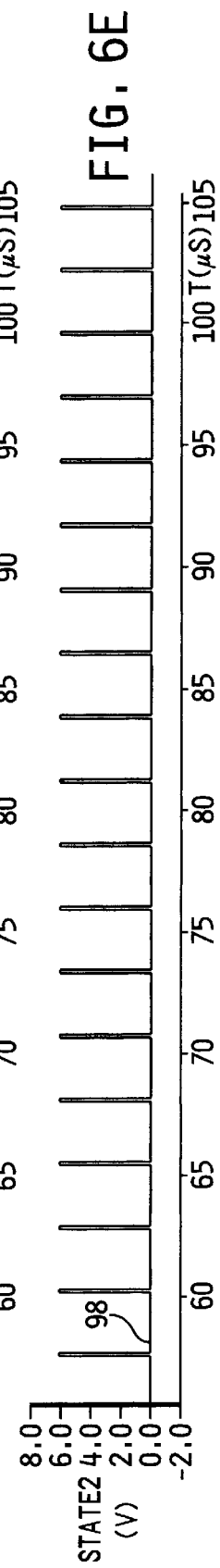
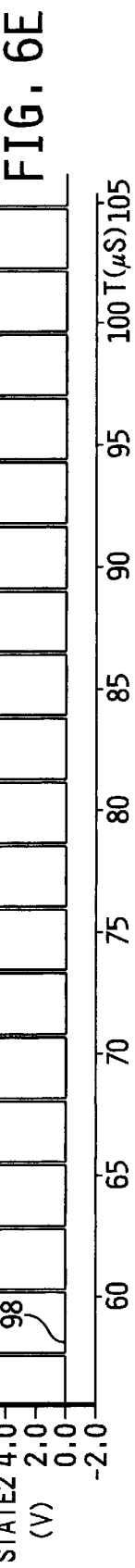

VARIABLE DUTY CYCLE OSCILLATOR CIRCUIT WITH FIXED MINIMUM AND MAXIMUM DUTY CYCLES

TECHNICAL FIELD

The present invention relates generally to circuitry for controlling power supplies, and more specifically to oscillator circuitry for generating variable duty cycle PWM signals from which power supply operation can be controlled.

BACKGROUND OF THE INVENTION

As the number and complexity of electronic systems for automotive applications has grown in recent years, so too have power dissipation requirements for such systems. In an attempt to manage and conserve electrical power in the automotive environment, designers of automotive electronic systems have developed switchable power supplies that may themselves be electronically controlled to thereby reduce power dissipation in electrical components connected to such supplies. One particular class of switchable power supplies utilizes a pulse-width modulated (hereinafter "PWM") signal with a variable duty cycle to control the power supply in such a manner as to down regulate battery voltage to certain electrical components under certain operating conditions. An example of one known switchable power supply utilizes a boost supply and a PWM signal with a variable duty cycle to control the switching operation of a power transistor to thereby pulse-width modulate the battery voltage supplied to certain electrical components. In this design, an error amplifier with feedback monitors the boost voltage and compares it to the battery voltage. The output of this error amplifier is compared to an oscillating ramp signal of an oscillation circuit, and the result of this comparison is a PWM signal that is used to control the operation of the power transistor. The comparator thresholds, along with the charge and discharge rates of the ramp signal, control the minimum and maximum duty cycles of the PWM signal.

One example of a known oscillator circuit 10 for generating an oscillating ramp signal, comparing the ramp signal to an error signal provided by an error amplifier, and generating a PWM signal therefrom as just described, is shown in FIG. 1. Referring to FIG. 1, oscillator circuit 10 includes a series-connected resistor ladder comprising resistors R1,R2, R3 and R4, wherein one end of R1 is connected to a supply voltage VCC and one end of R4 is connected to ground potential. The common connection of R1 and R2 defines a first reference voltage VR1 and is connected to an inverting input of a first comparator C1. The common connection of R2 and R3 likewise defines a second reference voltage VR2 and is connected to an inverting input of a second comparator C2, while the common connection of R3 and R4 defines a third reference voltage VR3 and is connected to an inverting input of a third comparator C3. A fourth comparator C4 is also provided and includes an inverting input receiving an error signal ERR from output of an error amplifier (not shown) comparing the boost voltage to the battery voltage. A resistor ROSC is connected at one end to VCC and at an opposite end to one end of a capacitor C having an opposite end connected to ground potential. The common connection of ROSC and C defines an oscillating ramp signal OSC and is connected to the non-inverting inputs of comparators C1–C4 as well as to a collector of a NPN transistor Q4.

The output of comparator C3 defines a comparator voltage VC3 and is fed through an inverter to a "set" input S of a first latch circuit L1. A "reset" input R of latch circuit L1 receives comparator voltage VC1 defined by an output of comparator C1. Likewise, the output of comparator C2 defines a comparator voltage VC2 and is supplied to a "reset" input R of a second latch circuit L2, and the output of comparator C4 defines a comparator voltage VC4 and is supplied to a "set" input S of latch circuit L2. A "Q" output of latch circuit L1 is connected to the base of a NPN transistor Q1 having an emitter connected to ground potential and a collector connected to the base of a NPN transistor Q2, the collector of a NPN transistor Q3 and one end of a current source Ix having an opposite end connected to VCC. The emitter of Q2 is connected to the bases of Q3 and Q4, and the emitters of Q3 and Q4 are connected to the bases of NPN transistors Q8 and Q5 as well as to the collector of Q5. The collector of Q8 is connected to the collector of a NPN transistor Q7 and defines the circuit output PWMOUT, and the base of Q7 is connected to the "Q" output of latch circuit L2. The emitters of Q5, Q7 and Q8 are connected to ground potential.

Referring now to FIG. 2, which is composed of FIGS. 2A–2G, some of the signals associated with the operation of oscillator circuit 10 of FIG. 1 are illustrated. The outputs VC1 22 (FIG. 2F) and VC3 20 (FIG. 2E) of comparators C1 and C3 respectively control the OSC waveform 24 (FIG. 2G) by the use of latch circuit L1 and associated transistor circuitry. The PWM output signal 12 (FIG. 2A) is created by the interaction of the same transistor circuitry (Q1–Q8) and the output voltage VC2 18 (FIG. 2D) of comparator C2. The variability in the duty cycle of the PWMOUT signal 12 is accomplished by the interaction of the output voltage VC4 14 (FIG. 2B), which is the comparison of the ERR signal 25 (FIG. 2G) and the OSC signal 24.

The threshold voltages for the OSC signal 24 are VR1 26 and VR3 30 (FIG. 2G), and the output voltage VL1 16 (FI. 2C) of latch circuit L1 provides the maximum duty cycle of the PWMOUT signal 12 when ERR 25 is above the peak of the OSC signal 24. The duty cycle of PWMOUT in this case is dependent upon the ratio of the charge and discharge times of the capacitor C. The minimum duty cycle of PWMOUT 12 occurs when ERR 25 is below the peak of the OSC signal 24, and in this state, the PWMOUT signal 12 is the inverse of VC2 18 which holds the latch circuit L2 in reset, wherein the threshold voltage for the switching of VC2 18 is VR2 28 (FIG. 2G). As ERR 25 increases between the lower and upper peaks of OSC 24, the output of latch circuit L2 is modified by the interaction of VC4 14 which sets the latch circuit L2.

While the prior art circuit 10 of FIG. 1 is operable as described to provide a variable duty cycle PWM output signal, there are several drawbacks with the structure and operation of this circuit. For example, the minimum and maximum duty cycles of the PWMOUT signal 12 may vary depending upon variations in circuit component operation; i.e., with the charging and discharging times of capacitor C as well as with the operation of comparator C2. In any case, the minimum and maximum duty cycles of the PWMOUT signal 12 are not fixed as would be desirable in a circuit of this type. As another example, many different circuit parameters contribute to the variation of the duty cycle of PWMOUT 12 between the minimum and maximum duty cycles thereof. Accordingly, this variation is subject to multiple sources of error, and very accurate circuit operation therefore cannot be guaranteed or expected. What is therefore needed is an improved oscillator circuit for generating an accurate variable duty cycle PWM signal with fixed minimum and maximum duty cycles. Ideally, such an improved oscillator circuit is provided in accordance with a simplified circuit design utilizing minimum circuitry and minimal signal comparisons.

SUMMARY OF THE INVENTION

The foregoing shortcomings of the prior art are addressed by the present invention. In accordance with one aspect of the present invention, an oscillator circuit comprises an oscillation circuit producing a first periodic clock signal as a function of a first capacitor, a second periodic clock signal as a function of a second capacitor and a periodic ramp signal as a function of a third capacitor, a comparator circuit responsive to an error signal and the periodic ramp signal to produce a third clock signal as a function thereof, and a logic circuit responsive to the first, second and third clock signals to produce a periodic output signal as a function thereof.

In accordance with another aspect of the present invention, an oscillator circuit comprises an oscillation circuit producing first and second periodic clock signals and a periodic ramp signal, a comparator circuit responsive to an error signal and the periodic ramp signal to produce a pulse width modulated (PWM) clock signal as a function thereto, and a logic circuit responsive to the PWM clock signal to produce a periodic output signal in accordance with the first clock signal if the PWM clock signal is fixed at a first logic state, in accordance with the second clock signal if the PWM clock signal is fixed at a second opposite logic state, and in accordance with the PWM clock signal if the PWM clock signal is periodically switching between the first and second logic states.

In accordance with a further aspect of the present invention, a method of producing a periodic switching signal comprises the steps of producing a minimum duty cycle periodic clock signal, producing a maximum duty cycle periodic clock signal, producing a periodic ramp signal, producing a pulse width modulated (PWM) clock signal as a function of an error signal and the periodic ramp signal, and producing a periodic output signal in accordance with the minimum duty periodic clock signal if the PWM clock signal is fixed at a first signal level, in accordance with the maximum duty cycle periodic clock signal if the PWM clock signal is fixed at a second opposite signal level, and in accordance with the PWM clock signal if the PWM clock signal is periodically switching between the first and second signal levels.

One object of the present invention is to provide an improved oscillator circuit for generating a periodic pulse-width modulated (PWM) output signal.

Another object of the present invention is to provide such an improved oscillator circuit for generating a PWM output signal as a function of a comparison between a periodic ramp signal and an error signal.

Yet another object of the present invention is to provide such an improved oscillator circuit for generating a PWM output signal as a function of a comparison between a periodic ramp signal and an error signal, wherein the PWM output signal has predefined minimum and maximum duty cycles.

These and other objects of the present invention will become more apparent from the following description of the preferred embodiment.

BRIEF DESCRIPTION OF THE DRAWINGS

The present invention will now be described, by way of example, with reference to the accompanying drawings, in which:

FIG. 2 is composed of FIGS. 2A–2G and illustrates a number of plots representing various signal waveforms associated with the operation of the prior art oscillator circuit of FIG. 1.

FIG. 6 is composed of FIGS. 6A–6E and illustrates a number of plots representing various signal waveforms associated with the operation of the oscillator circuit of FIG. 5.

DESCRIPTION OF THE PREFERRED EMBODIMENTS

Figure 1:
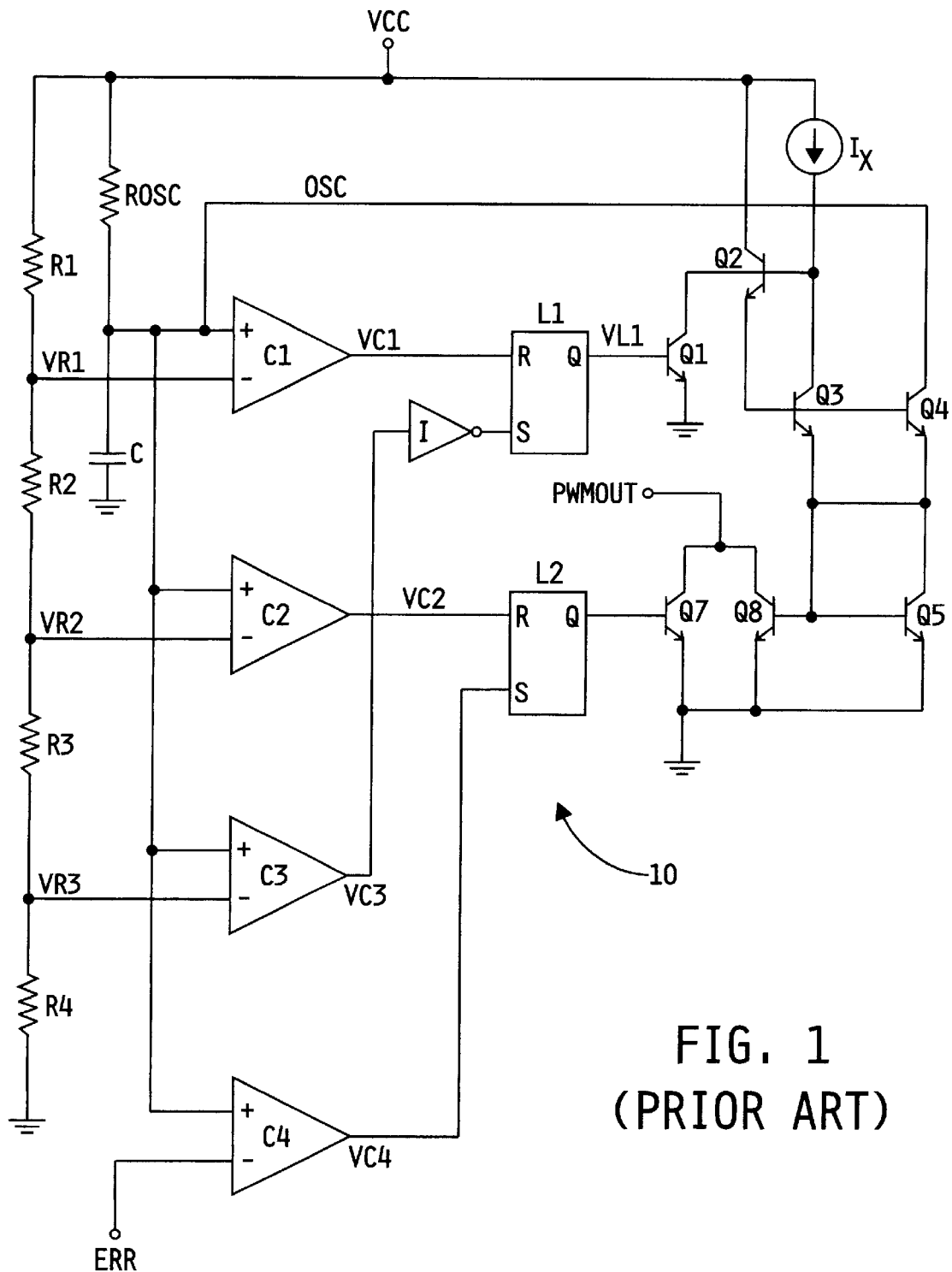
FIG. 1 is a diagrammatic illustration of a prior art oscillator circuit for generating a pulse-width modulated output signal.
Figure 3:
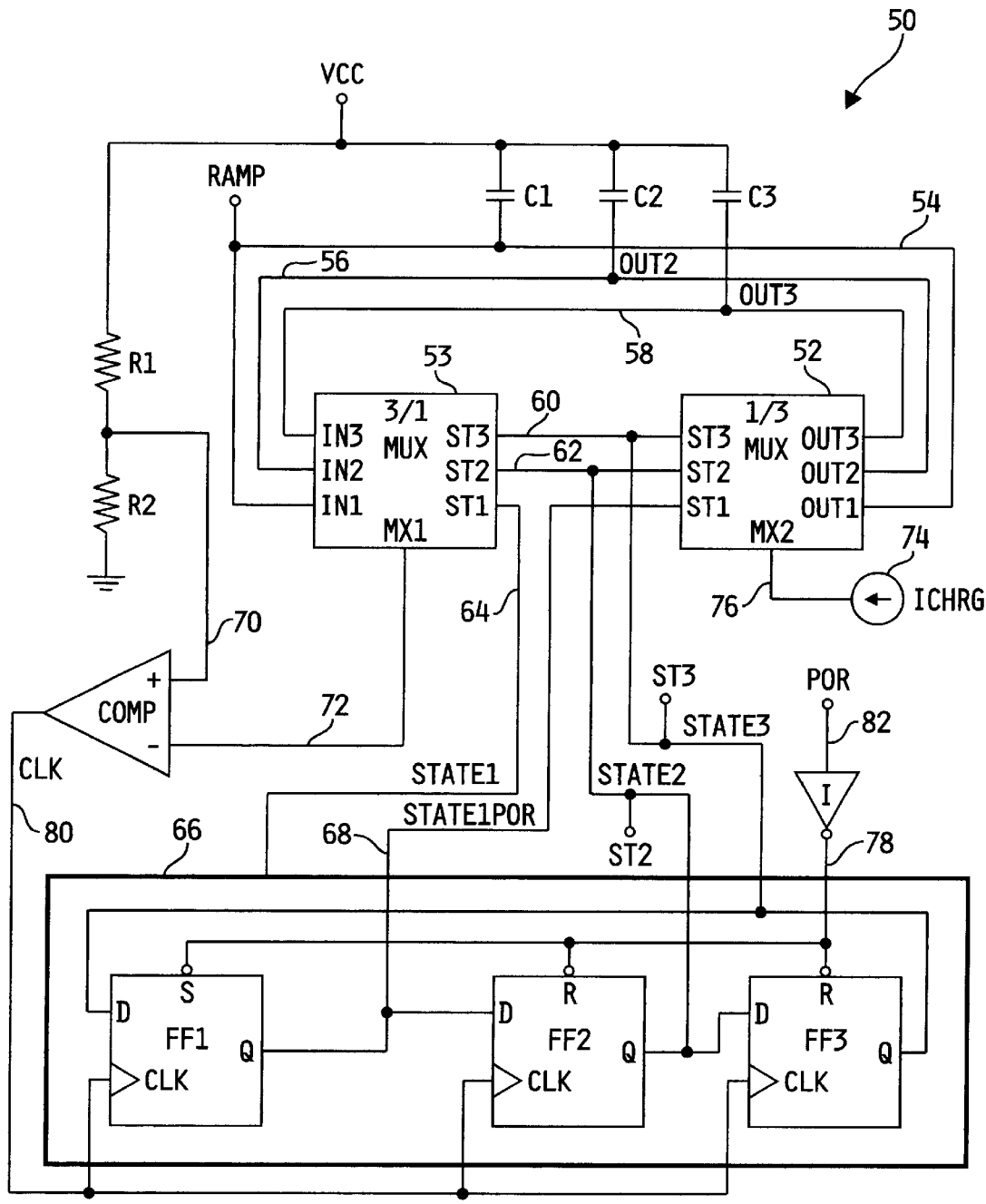
FIG. 3 is a diagrammatic illustration of one preferred embodiment of an oscillation circuit, in accordance with the present invention.

Referring now to FIG. 3, one preferred embodiment of an oscillation circuit 50, in accordance with the present invention, is shown. Circuit 50 includes three capacitors C1, C2 and C3 each having a first end connected to a supply voltage VCC. An opposite end of C1 is connected to an output OUT1 of a multiplexor circuit 52 and to an input IN1 of a second multiplexor circuit 53 via signal path 54, wherein circuit path 54 carries a periodic switching signal RAMP. An opposite end of C2 is connected to an output OUT2 of multiplexor circuit 52 and to an input IN2 of multiplexor circuit 53 via signal path 56. An opposite end of C3 is connected to an output OUT3 of multiplexor circuit 52 and to an input IN3 of multiplexor circuit 53 via signal path 58. An input MX2 of multiplexor circuit 52 is connected to a current source 74 via signal path 76 and is operable to receive current ICHRG therefrom. An output MX1 of multiplexor circuit 53 is connected to an inverting input of a comparator COMP via signal path 72, wherein a non-inverting input of comparator COMP is connected to one end of each of two resistors R1 and R2 via signal path 70. The opposite end of R2 is connected to ground potential, or alternatively to some other reference potential, and the opposite end of R1 is connected to the supply voltage VCC. Comparator COMP is responsive to a switching signal produced by multiplexor circuit 53 at output MX1 and to a threshold signal produced by the common connection of R1 and R2 to produce a clock signal CLK at an output thereof.

In one preferred embodiment, current source 74 is operable to produce a constant current ICHRG that is multiplexed by circuit 52 and provided to capacitors C1, C2 and C3 via outputs OUT1, OUT2 and OUT3 respectively. In accordance with one important aspect of the present invention, the current ICHRG is preferably steered in the foregoing manner to capacitors C1–C3 via multiplexor circuit 52 so that the three capacitors C1–C3 are each charged with the same current (ICHRG). This arrangement is preferable to avoid variations in charging current between capacitors C1–C3 that may otherwise occur due to circuit mismatches if two or more separate current sources were used to charge capacitors C1–C3. The first multiplexor circuit 52 is preferably a 1/3 multiplexor to thereby provide the same current ICHRG at each of the three outputs OUT1–OUT3. Likewise, the second multiplexor circuit 53 is preferably a 3/1 multiplexor to thereby combine the charging effects of each of the three capacitors C1–C3 onto a single output signal.

In any case, multiplexor circuits 52 and 53 each include three "state" inputs ST1–ST3, wherein ST3 of circuit 52 is connected to ST3 of circuit 53 via signal path 60. Signal path 60 is further connected to a "D" input of a first flip-flop circuit FF1 and to a "Q" output of a third flip-flop circuit FF3, wherein FF1 and FF3 form part of a shift register 66. State ST2 of multiplexor circuit 52 is likewise connected to ST2 of multiplexor circuit 53 via signal path 62, wherein signal path 62 is further connected to a "Q" output of a second flip-flop circuit FF2 and to a "D" input of FF3. Signal paths 62 and 60 also define corresponding circuit outputs ST2 and ST3 carrying the signals STATE2 and STATE3 respectively. ST1 of multiplexor circuit 52 is connected to a "Q" output of FF1 and to a "D" input of FF2 via signal path 68, and defines the signal STATE1POR. ST1 of multiplexor circuit 53, on the other hand, is connected to an output of shift register 66 via signal path 64, and defines the signal STATE1.

An inverter "I" receives a power-on-reset signal POR from an external source via signal path 82 connected to a POR input of circuit 50. The output of inverter "I" is connected to "reset" inputs of FF2 and FF3, and to a "set" input of FF1, via signal path 78. Each of the flip-flop circuits FF1, FF2 and FF3 also include a clock input CLK that is connected to the output of the comparator COMP via signal path 80, whereby comparator COMP supplies a clock signal CLK thereto.

In the oscillation circuit 50 of FIG. 3, capacitors C1–C3 are ratioed relative to each other such that each capacitor develops a specified frequency, and wherein the three frequencies add together to form 100% of a fixed frequency. More specifically, each of the three capacitors is sized so that they collectively produce a desired fixed frequency. In one embodiment, C1 is sized to develop approximately 85% of the period, C2 is sized to develop approximately 5% of the period and C3 is sized to develop approximately 10% of the period. In one specific implementation of circuit 50, for example, the foregoing ratios are achieved with capacitor values of C1=23.325 pf, C2=1.015 pf and C3=2.03 pf. It is to be understood, however, that the present invention contemplates sizing C1–C3 to achieve other desired ratios.

In any case, the ramp waveforms generated by the charging of each of the three capacitors C1–C3 are combined together by multiplexor circuit 53 and provided as a single signal to the inverting input of comparator COMP via output MX1. The non-inverting input of COMP is connected to a fixed DC reference established by resistors R1 and R2, wherein the value of the DC reference controls the charging level of capacitors C1–C3. With this arrangement, offsets in the comparator COMP accordingly do not affect the ratio of the min and max duty cycles of the total period of the desired frequency set by C1–C3.

Referring now to FIGS. 3 and 4A–4I, the operation of circuit 40 of FIG. 3 will be described in detail. The oscillation circuit 50 is initialized by a high (VCC) state of a power-on-reset (POR) signal 106 (FIG. 4I), whereby the shift register 66 enters a "state 1" state with the "Q" output of FF1 set to a high state and with the "Q" outputs of FF2 and FF3 set to a low state. While the POR signal 106 is high, the STATE1POR signal 100 (FIG. 4F) is inverted from the STATE1 signal 102 (FIG. 4G) to ensure that each of the capacitors C1–C3 start out discharged. The capacitors C1–C3 are discharged by multiplexor circuit 52 by forcing OUT1–OUT3 to the supply voltage VCC when the state inputs ST1–ST3 are low. When the POR signal 106 switches to a low state, the STATE1POR signal 100 tracks the STATE1 signal 102 as shown in FIGS. 4F and 4G.

In the "state 1" state just described, the ICHRG current supplied to the MX2 input of multiplexor circuit 52 is directed by circuit 52 to capacitor C1 and the resulting RAMP voltage 94 (FIG. 4C) on signal path 54 is directed to the inverting input of comparator COMP by multiplexor circuit 53. In one preferred embodiment, as described hereinabove, the value of capacitor C1 relative to C2 and C3, and the reference voltage at the common connection of R1 and R2, are chosen so that the charging time of C1 to reach the reference voltage corresponds to approximately 85% of the total period of the desired frequency. It is to be understood, however, that the value of C1 and/or the reference voltage established at the common connection of R1 and R2 may alternatively be chosen to establish other desired percentages of the total period of the desired frequency. In any case, when C1 has charged to the reference voltage, the comparator COMP changes state resulting in a rising edge of the CLK signal 104 (FIG. 4H). The rising edge of CLK 104 causes the "Q" output of FF1 (STATE1POR 100) to switch from a high to a low state, and the "Q" output of FF2 (STATE2 98) to switch from a low to a high state as shown in FIGS. 4F and 4E respectively. The switching of the STATE2 signal 98 from a low to a high state causes multiplexor circuits 52 and 53 to switch simultaneously to a "state 2" state wherein multiplexor circuit 52 directs the ICHRG current to capacitor C2 and multiplexor circuit 53 directs the OUT2 voltage 92 (FIG. 4B) to the inverting input of comparator COMP. Since OUT2 92 was previously held at supply voltage (VCC), the comparator COMP again changes state so that the CLK output 104 switches to a low state. At the same time, capacitor C1 is discharged by multiplexor circuit 52.

In one preferred embodiment, as described hereinabove, the value of capacitor C2 relative to C1 and C3, and the reference voltage at the common connection of R1 and R2, are chosen so that the charging time of C2 to reach the reference voltage corresponds to approximately 5% of the total period of the desired frequency. It is to be understood, however, that the value of C2 and/or the reference voltage established at the common connection of R1 and R2 may alternatively be chosen to establish other desired percentages of the total period of the desired frequency. In any case, when C2 has charged to the reference voltage, the comparator COMP again changes state resulting in a rising edge of the CLK signal 104 (FIG. 4H). The rising edge of CLK 104 causes the "Q" output of FF2 (STATE2 98) to switch from a high to a low state, and the "Q" output of FF3 (STATE3 96) to switch from a low to a high state as shown in FIGS. 4E and 4D respectively. The switching of the STATE3 signal 96 from a low to a high state causes multiplexor circuits 52 and 53 to switch simultaneously to a "state 3" state wherein multiplexor circuit 52 directs the ICHRG current to capacitor C3 and multiplexor circuit 53 directs the OUT3 voltage 90 (FIG. 4A) to the inverting input of comparator COMP. Since OUT3 90 was previously held at supply voltage (VCC), the comparator COMP again changes state so that the CLK output 104 switches to a low state. At the same time, capacitor C2 is discharged by multiplexor circuit 52.

In one preferred embodiment, as described hereinabove, the value of capacitor C3 relative to C1 and C2, and the reference voltage at the common connection of R1 and R2, are chosen so that the charging time of C3 to reach the reference voltage corresponds to approximately 10% of the total period of the desired frequency. It is to be understood, however, that the value of C3 and/or the reference voltage established at the common connection of R1 and R2 may alternatively be chosen to establish other desired percentages of the total period of the desired frequency. In any case, when C3 has charged to the reference voltage, the comparator COMP again changes state resulting in a rising edge of the CLK signal 104 (FIG. 4H). The rising edge of CLK 104 causes the "Q" output of FF3 (STATE3 96) to switch from a high to a low state, and the "Q" output of FF1 (STATE1 102), as well as STATE1POR 100, to switch from a low to a high state as shown in FIGS. 4E and 4D respectively. The switching of the STATE1 and STATE1POR signals 102 and 100 from a low to a high state causes multiplexor circuits 52 and 53 to switch simultaneously back to the "state 1" state wherein multiplexor circuit 52 directs the ICHRG current to capacitor C1 and multiplexor circuit 53 directs the RAMP voltage 94 (FIG. 4A) to the inverting input of comparator COMP. Since OUT3 90 was previously held at supply voltage (VCC), the comparator COMP again changes state so that the CLK output 104 switches to a low state. At the same time, capacitor C3 is discharged by multiplexor circuit 52 and the foregoing cycle repeats itself.

Figure 4:
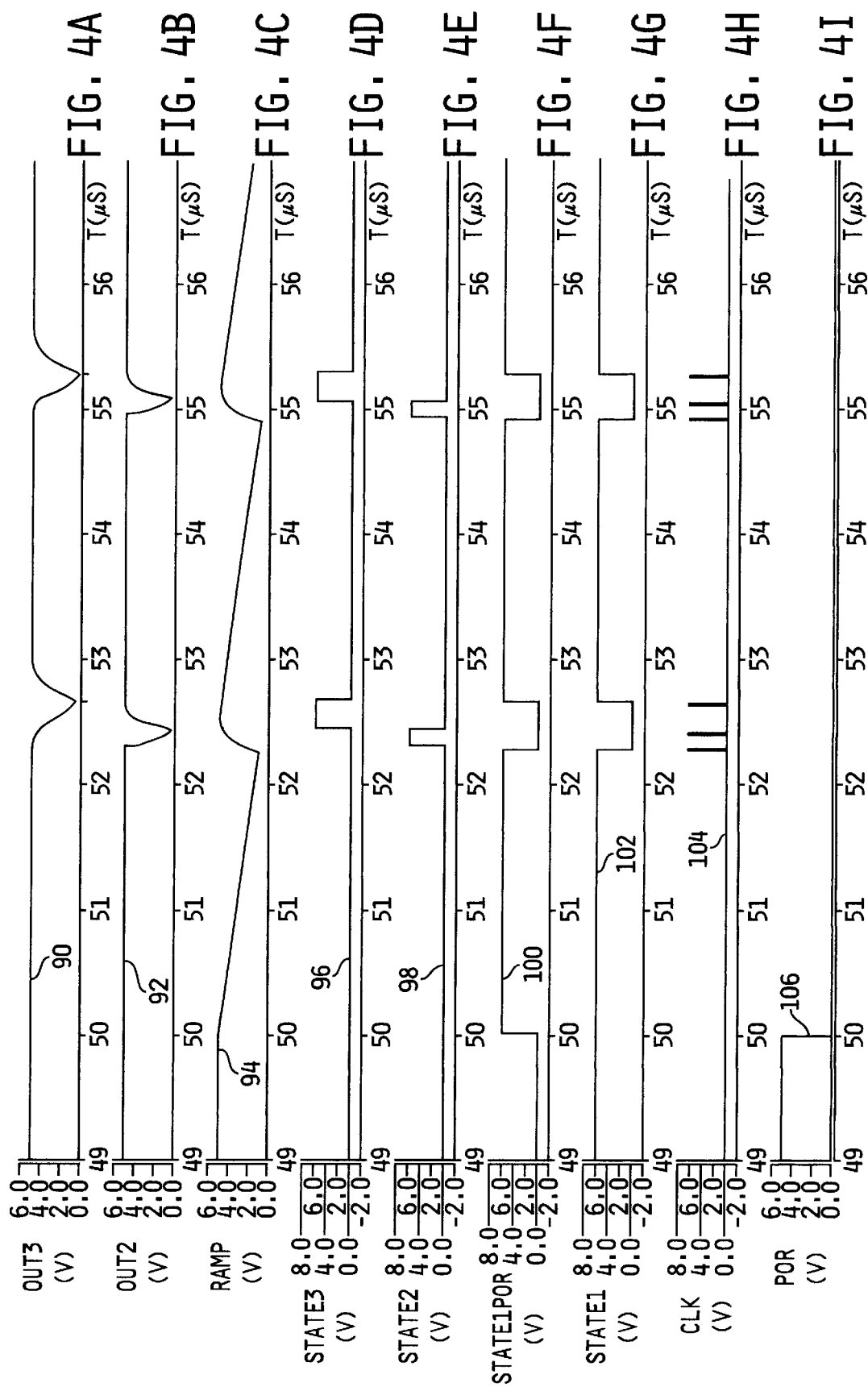
FIG. 4 is composed of FIGS. 4A–4I and illustrates a number of plots representing various signal waveforms associated with the operation of the oscillation circuit of FIG. 3.
Figure 5:
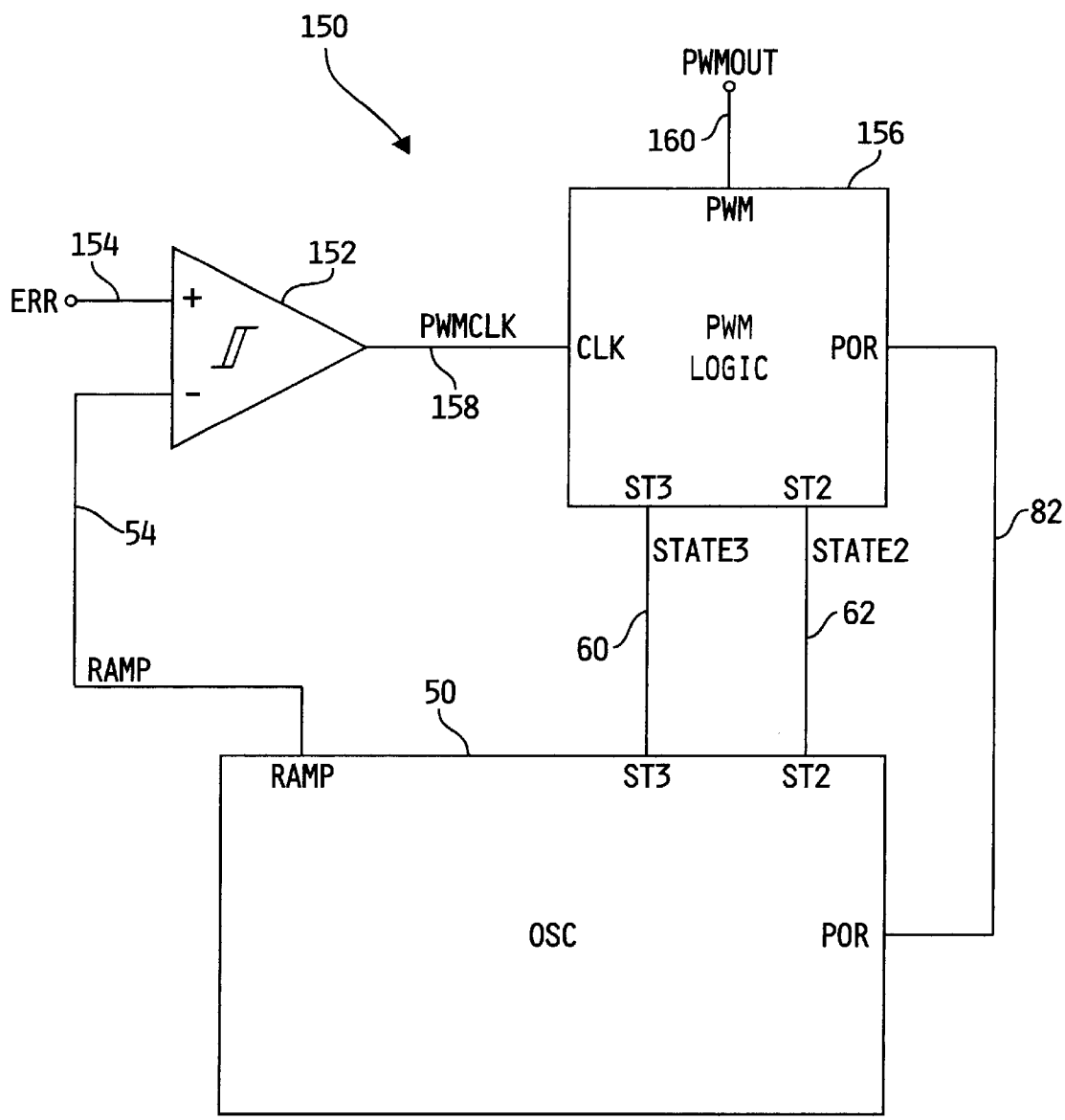
FIG. 5 is a diagrammatic illustration of one preferred embodiment of an oscillator circuit, using the oscillation circuit of FIG. 3, for generating a PWM output signal in accordance with the present invention.

A primary purpose of the oscillation circuit 50 illustrated in FIGS. 3 and 4 is to facilitate production of a PWM signal with a variable duty cycle. This is accomplished, in one preferred embodiment, with some additional logic circuitry and another comparator. Referring to FIG. 5, one preferred example of an oscillator circuit 150 utilizing the oscillation circuit 50 of FIGS. 3 and 4 to produce a PWM signal with a variable duty cycle, in accordance with the present invention, is shown. In addition to the oscillation circuit 50 (OSC), oscillator circuit 150 includes a comparator 152 having an inverting input connected to the RAMP output of the OSC circuit 50 and receiving the RAMP signal 94 thereat. A non-inverting ERR input of comparator 152 receives an error signal (ERR) from an external error amplifier, and an output of the comparator 152 produces a PWMCLK signal on signal path 158.

The output of comparator 152 is connected to a CLK input of a PWM logic circuit 156 via signal path 158. The PWM logic circuit 156 also includes POR, ST2 and ST3 inputs connected to corresponding POR, ST2 and ST3 outputs of OSC circuit 50 via signal paths 82, 62 and 60 respectively. A PWM output of PWM logic circuit 156 produces a PWMOUT signal on signal path 160, wherein the PWMOUT signal is the desired variable frequency, PWM signal.

The logic block PWM logic 156 is, in one embodiment, comprised of simple logic that uses the PWMCLK signal and the shift register 66 signals STATE2 98 and STATE3 96 to produce the variable pulse-width PWM signal PWMOUT. The STATE2 signal 98 invokes the PWM logic block 156 to produce a high state PWMOUT signal and the STATE3 signal 96 invokes block 156 to produce a low state PWMOUT signal. The PWMCLK signal at the output of comparator 152 varies in accordance with the RAMP voltage 94 and the ERR voltage produced by an external error amplifier (not shown), and invokes the PWM logic block 156 to produce a variable pulse-width PWMOUT signal as a function of the RAMP 94 and ERR signals.

Referring now to FIGS. 5 and 6, the operation of the oscillator circuit 150 will be described in detail. In FIG. 6A, the RAMP voltage 94 is shown along with an ERR voltage that increases from less than the minimum RAMP voltage 94 to the maximum RAMP voltage 94. The resulting PWMCLK signal 174 is shown in FIG. 6B wherein PWMCLK 174 is held low by comparator 152 while ERR 172 is less than or equal to RAMP 94, and is held high by comparator 152 while ERR 172 is greater than or equal to RAMP 94. As ERR varies between the minimum and maximum values of RAMP 94, the duty cycle of PWMCLK 174 accordingly varies as shown in FIG. 6B, and the PWMOUT signal 176 produced by the PWM logic block 156 is identical to the PWMCLK signal 174 under these conditions. This yields a variable duty cycle under such conditions encompassing approximately 85% of the total period according to the approximate 85% ratio of C1 to (C1+C2+C3) in oscillation circuit 50. The PWM logic block 156 further include simple logic functions that operate to add the STATE2 98 signal to the PWMOUT signal 176 during the low state of PWMCLK 174 when ERR 172 is less than or equal to RAMP 94, and to add the inverse of the STATE3 96 signal to the PWMOUT signal 176 during the high state of PWMCLK 174 when ERR 172 is greater than or equal to RAMP 94. Thus, when ERR 172 is less than or equal to RAMP 94, no PWMCLK signal 174 is produced and the PWMOUT signal 176 is affected only by the STATE2 signal 98. This yields a fixed duty cycle under such conditions with a signal on-time of approximately 5% of the total period according to the approximate 5% ratio of C2 to (C1+C2+C3) in oscillation circuit 50. Likewise, when ERR 172 is greater than or equal to RAMP 94, the PWMCLK signal 174 remains in a high state and the PWMOUT signal 176 is affected only by the STATE3 signal 96. This yields a fixed duty cycle under such conditions with a signal off-time of approximately 10%, corresponding to a duty cycle of approximately 90%, of the total period according to the approximate 10% ratio of C3 to (C1+C2+C3) in oscillation circuit 50.

From the foregoing, it should now be apparent that the oscillator circuit 150 of the present invention is operable to produce a PWM signal PWMOUT 176 with a fixed frequency and a variable duty cycle with specific minimum and maximum duty cycles. The minimum and maximum duty cycles of the PWMOUT signal 176 are defined by capacitor ratios, wherein three such capacitors C1–C3 are sized to provide the PWMOUT signal 176 with a fixed "on-time", a fixed "off-time" and a "ramp time." These time functions are part of a three-state operation, wherein "state 1" uses the "ramp time" to produce the variable portion of the duty cycle which, in a preferred embodiment, is approximately 85% of the total period. "State 2" uses the "on-time" to produce a maximum duty cycle which, in a preferred embodiment, is approximately 95% of the total period. "State 3" uses the "off-time" to produce a minimum duty cycle which, in a preferred embodiment, is approximately 90% of the total period. The variation in the duty cycle of PWMOUT 176 between the approximate 5% and 90% minimum and maximum duty cycles is accomplished by comparing the RAMP voltage 94 to the output of an external error amplifier that compares a regulated output voltage to a fixed reference voltage. As the difference between the fixed reference voltage and the regulated output voltage increases, the "on-time" portion of the period of PWMOUT 176 increases.

While the invention has been illustrated and described in detail in the foregoing drawings and description, the same is to be considered as illustrative and not restrictive in character, it being understood that only the preferred embodiments have been shown and described and that all changes and modifications that come within the spirit of the invention are desired to be protected.

What is claimed is:

1. An oscillator circuit comprising:

an oscillation circuit producing a first periodic clock signal as a function of a first capacitor, a second periodic clock signal as a function of a second capacitor and a periodic ramp signal as a function of a third capacitor;

a comparator circuit responsive to an error signal and said periodic ramp signal to produce a third clock signal as a function thereof; and a logic circuit responsive to said first, second and third clock signals to produce a periodic output signal as a function thereof.

2. The oscillator circuit of claim 1 wherein said oscillation circuit is operable to produce each of said first and second clock signals and said periodic ramp signal as fixed frequency signals.

3. The oscillator circuit of claim 1 wherein said logic circuit is responsive to said first, second and third clock signals to produce said periodic output signal in accordance with said first periodic clock signal when said third clock signal is fixed at a first logic state, in accordance with said second clock signal when said third clock signal is fixed at a second opposite logic state and in accordance with said third clock signal when said third clock signal is periodically switching between said first and second logic states.

4. The oscillator circuit of claim 3 wherein said first periodic clock signal corresponds to a minimum duty cycle of said periodic output signal.

5. The oscillator circuit of claim 4 wherein said second periodic clock signal corresponds to a maximum duty cycle of said periodic output signal.

6. The oscillator circuit of claim 5 wherein said comparator circuit is operable to produce said third clock signal as a variable duty cycle clock signal based on said error signal relative to said periodic ramp signal.

7. An oscillator circuit comprising:

an oscillation circuit producing first and second periodic clock signals and a periodic ramp signal;

a comparator circuit responsive to an error signal and said periodic ramp signal to produce a pulse width modulated (PWM) clock signal as a function thereof; and a logic circuit responsive to said PWM clock signal to produce a periodic output signal in accordance with said first clock signal if said PWM clock signal is fixed at a first logic state, in accordance with said second clock signal if said PWM clock signal is fixed at a second opposite logic state, and in accordance with said PWM clock signal if said PWM clock signal is periodically switching between said first and second logic states.

8. The oscillator circuit of claim 7 wherein said first periodic clock signal corresponds to a minimum duty cycle of said periodic output signal.

9. The oscillator circuit of claim 8 wherein said inverse of said second periodic clock signal corresponds to a maximum duty cycle of said periodic output signal.

10. The oscillator circuit of claim 7 wherein said oscillation circuit is configured to produce said first periodic clock signal as a function of a first capacitor, to produce said second periodic clock signal as a function of a second capacitor, and to produce said periodic ramp signal as a function of a third capacitor.

11. The oscillator circuit of claim 10 further including:

a three-to-one (3/1) multiplexor circuit having first, second and third state inputs, first, second and third signal inputs, and an output;

a one-to-three (1/3) multiplexor circuit having first, second and third state inputs, first, second and third outputs, and a signal input; and a shift register;

and wherein one end of each of said first, second and third capacitors is connected to corresponding ones of said first, second and third inputs of said 3/1 multiplexor circuit and to corresponding ones of said first, second and third outputs of said 1/3 multiplexor circuit;

and wherein said second and third state inputs of said 3/1 multiplexor circuit are connected to said second and third state inputs of said 1/3 multiplexor circuit;

and wherein said first state inputs of each of said 3/1 and 1/3 multiplexor circuits are each connected to said shift register.

12. The oscillator circuit of claim 11 wherein opposite ends of each of said first, second and third capacitors are each connected to a supply voltage.

13. The oscillator circuit of claim 11 further including a comparator circuit having a non-inverting input connected to a reference voltage, an inverting input connected to said output of said 3/1 multiplexor circuit and an output connected to a clock input of said shift register.

14. The oscillator circuit of claim 13 further including a current source connected to said input of said 1/3 multiplexor circuit.

15. The oscillator circuit of claim 13 wherein said shift register includes first, second and third flip-flop circuits each having an input and an output, said output of said first flip-flop circuit connected to said input of said second flip-flop circuit and to said first state input of said 1/3 multiplexor, said output of said second flip-flop circuit connected to said input of said third flip-flop circuit and to said second state input of said 1/3 multiplexor, and said output of said third flip-flop circuit connected to said input of said first flip-flop circuit.

16. The oscillator circuit of claim 15 wherein each of said first, second and third flip-flop circuits includes a clock input, said output of said comparator circuit connected to said clock input of each of said first, second and third flip-flop circuits.

17. The oscillator circuit of claim 16 wherein said first flip-flop circuit includes a set input coupled to a power-on-reset (POR) input of said oscillator circuit, and said second and third flip-flop circuits each include reset inputs coupled to said POR input.

18. A method of producing a periodic switching signal, comprising the steps of:

producing a minimum duty cycle periodic clock signal;

producing a maximum duty cycle periodic clock signal;

producing a periodic ramp signal;

producing a pulse width modulated (PWM) clock signal as a function of an error signal and said periodic ramp signal; and producing a periodic output signal in accordance with said minimum duty cycle periodic clock signal if said PWM clock signal is fixed at a first signal level, in accordance with said maximum duty cycle periodic clock signal if said PWM clock signal is fixed at a second opposite signal level, and in accordance with said PWM clock signal if said PWM clock signal is periodically switching between said first and second signal levels.

19. The method of claim 18 wherein the step of producing said minimum duty cycle periodic clock signal includes producing said minimum duty cycle periodic clock signal as a function of a first capacitor;

wherein the step of producing said maximum duty cycle periodic clock signal includes producing said maximum duty cycle periodic clock signal as a function of a second capacitor;

and wherein the step of producing said periodic ramp signal includes producing said periodic ramp signal as a function of a third capacitor.

20. The method of claim 18 wherein each of said minimum duty cycle periodic clock signal, said maximum duty cycle periodic clock signal and said periodic ramp signal is a fixed frequency signal.

\* \* \* \* \*